(12) United States Patent
Uvieghara et al.

(10) Patent No.: US 9,082,498 B2
(45) Date of Patent: Jul. 14, 2015

(54) N-WELL SWITCHING CIRCUIT

(71) Applicant: QUALCOMM Incorporated, San Diego, CA (US)

(72) Inventors: Gregory Ameriada Uvieghara, Murrieta, CA (US); Sei Seung Yoon, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 47 days.

(21) Appl. No.: 13/962,702

(22) Filed: Aug. 8, 2013

(65) Prior Publication Data

US 2015/0043265 A1  Feb. 12, 2015

(51) Int. Cl.
*G11C 7/00*      (2006.01)
*G11C 17/18*     (2006.01)
*G11C 17/16*     (2006.01)
*H03K 3/356*     (2006.01)

(52) U.S. Cl.
CPC ............... *G11C 17/18* (2013.01); *G11C 17/16* (2013.01); *H03K 3/356113* (2013.01)

(58) Field of Classification Search
CPC .............................. G11C 7/00; G11C 13/0069

USPC .............. 365/189.011, 189.05, 189.14, 225.7
See application file for complete search history.

(56) References Cited

U.S. PATENT DOCUMENTS

| 5,371,419 | A | 12/1994 | Sundby |
| 6,466,079 | B1 | 10/2002 | Kushnarenko |
| 6,774,704 | B2 | 8/2004 | Kushnarenko |
| 6,847,512 | B2 | 1/2005 | Kitano |
| 2011/0025407 | A1 | 2/2011 | Brunsilius et al. |
| 2014/0198588 | A1* | 7/2014 | Terzioglu et al. ...... 365/189.011 |

* cited by examiner

*Primary Examiner* — Fernando Hidalgo
(74) *Attorney, Agent, or Firm* — Haynes and Boone, LLP

(57) ABSTRACT

A thin gate-oxide dual-mode PMOS transistor is disclosed that has a first mode of operation in which a switched n-well for the dual-mode PMOS transistor is biased to a high voltage. The dual-mode PMOS transistor has a second mode of operation in which the switched n-well is biased to a low voltage that is lower than the high voltage. The dual-mode PMOS transistor has a size and gate-oxide thickness each having a magnitude that cannot accommodate a permanent tie to the high voltage. An n-well voltage switching circuit is configured to bias the switched n-well to prevent voltage damage to the dual-mode PMOS transistor without the use of native transistors.

19 Claims, 5 Drawing Sheets

N-WELL SWITCHING CIRCUIT

TECHNICAL FIELD

This application relates to integrated circuits, and more particularly to an n-well biasing circuit to prevent latchup in high-density applications.

BACKGROUND

The source of a PMOS transistor is positively charged with regard to its drain during operation. This positive source voltage can be problematic in that a p-n junction exists between the source and the n-well for the PMOS transistor. If the source is biased sufficiently higher than the n-well, this p-n junction is then forward biased. A conducting parasitic structure results from this forward biased p-n junction and the ground connection to adjacent NMOS transistors. The resulting short circuit condition in the conducting parasitic structure is referred to as latchup. Latchup is dangerous in that a circuit can be destroyed from the latchup currents. Moreover, even if the circuit can withstand the short circuit, latchup inhibits normal operation.

To prevent latchup, it is conventional to tie the n-well for a PMOS transistor to the highest expected source voltage. For example, if a PMOS transistor can operate in a low voltage mode and also in a high voltage mode, it is conventional to tie the PMOS n-well to the high voltage supply used during the high voltage mode operation. But the n-well tie is problematic as transistor dimensions are reduced such as in deep sub-micron technology. At these modern high-density process nodes, the gate oxide is too thin and the transistor is too small to handle the stress resulting from tying the n-well to a relatively high voltage supply.

To solve the latchup problem for PMOS transistors in modern process nodes that can operate in both high and low voltage modes, it is conventional to use robust PMOS transistors. In other words, the transistor dimensions are increased and a relatively thick gate-oxide is used. Such a large and thick gate-oxide PMOS transistor can then have its n-well tied to the high voltage supply without stressing the transistor. But the large transistor dimensions demand a lot of die area relative to the smaller transistor dimensions used in modern process nodes.

To increase density, n-well switching circuits have been developed that switch the n-well potential depending upon the PMOS transistor's voltage mode of operation. During low voltage operation, the PMOS transistor is powered by a low voltage supply so the n-well switching circuit biases the n-well to the low voltage. In this fashion, the n-well cannot become forward biased with regard to the PMOS source since both are tied to the same low voltage. But during high power operation, the PMOS transistor is powered by a high voltage supply such that the n-well switching circuit biases the n-well to the high voltage. Again, the n-well cannot become forward biased with regard to the PMOS source since both are then tied to the high voltage. Since the potential for the n-well switches between the low and high voltages depending upon the mode of operation, it may be denoted as a switched n-well.

One type of n-well switching circuit biases the switched n-well in low power operation using a native NMOS transistor. The native NMOS transistor does not include an n-well but instead is formed in the p-type substrate. This is advantageous because there is no resulting p-n junction in the native NMOS transistor that can become forward biased if the switched n-well is biased to the high voltage during high power operation. But deep sub-micron semiconductor processes may not be able to support the production of native transistors.

Accordingly, there is a need in the art for latchup prevention architectures with increased density that do not include native transistors.

SUMMARY

An n-well voltage switching circuit is disclosed that controls the voltage for a switched n-well of a dual-mode PMOS transistor to prevent latchup. The dual-mode PMOS transistor operates in both a high voltage mode and a low voltage mode. In the high voltage mode, the n-well voltage switching circuit biases the switched n-well to a high voltage. This high voltage is at least as high as any expected source (or drain) voltage for the dual-mode PMOS transistor during operation in the high voltage mode. In this fashion, the p-n junction between the dual-mode PMOS transistor's source and the switched n-well does not get forward biased and latchup is prevented accordingly.

During the low voltage mode of operation, the n-well voltage switching circuit biases the switched n-well to a low voltage that is lower than the high voltage. This low voltage is sufficiently low such that the dual-mode PMOS transistor is not strained during the low voltage mode. The dual-mode PMOS transistor may thus be relatively small and have a thin-gate oxide to enhance density. A plurality of dual-mode PMOS transistors may have their switched n-wells biased by the n-well voltage switching circuit to further enhance density.

The n-well voltage switching circuit includes a first PMOS transistor configured to drive the switched n-well with the low voltage and a second PMOS transistor configured to drive the switched n-well with the high voltage. Both the first and second PMOS transistors are sufficiently large and have a thick gate-oxide such that a permanent coupling of both an n-well for the first PMOS transistor as well as an n-well for the second PMOS transistor to a high voltage supply providing the high voltage does not damage the first and second PMOS transistors. In contrast to the robust first and second PMOS transistors, the dual-mode PMOS transistor is a smaller thin gate-oxide transistor. The size and the gate-oxide thickness for the dual-mode PMOS transistor have a magnitude such that the switched n-well for the dual-mode PMOS transistor cannot be permanently coupled to the high voltage supply without incurring damage to the dual-mode PMOS transistor. To prevent such damage, the n-well voltage switching circuit is controlled so that the switched n-well is biased to the high voltage for no longer than a safe duration to protect the dual-mode PMOS transistor from damage despite its relatively small size and thin gate-oxide.

BRIEF DESCRIPTION OF THE DRAWINGS

Embodiments of the present invention and their advantages are best understood by referring to the detailed description that follows. It should be appreciated that like reference numerals are used to identify like elements illustrated in one or more of the figures.

DETAILED DESCRIPTION

Figure 1:
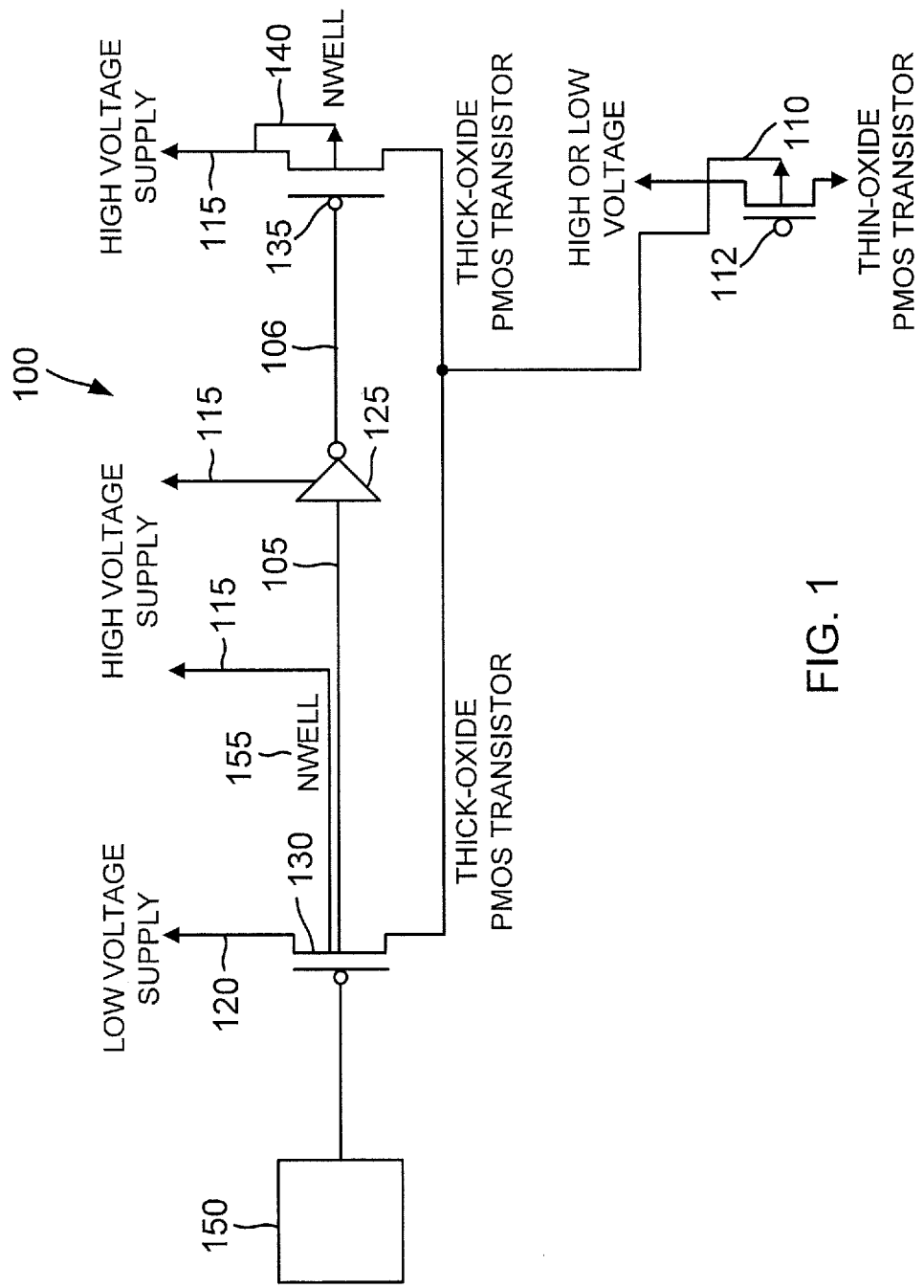
FIG. 1 is a schematic diagram for an n-well voltage switching circuit in which a high voltage supply should be powered on before a low voltage supply during a power on sequence.

Turning now to the drawings, FIG. 1 shows an example embodiment of an n-well voltage switching circuit 100 configured to be responsive to a mode control signal 105 from a controller 150. If controller 150 asserts mode control signal 105 to a high voltage, n-well voltage switching circuit 100 charges a switched n-well 110 for a dual-mode PMOS transistor 112 to the high voltage. On the other hand, if controller 150 pulls mode control signal 105 low to ground (VSS) because of a low voltage mode of operation for dual-mode PMOS transistor 112, n-well voltage switching circuit 100 biases switched n-well 110 to the low voltage. In this fashion, switched n-well 110 need not be permanently tied to a high voltage supply. As discussed further herein, dual-mode PMOS transistor 112 can then take advantage of the smaller dimensions and thinner gate oxide available in modern process nodes.

Controller 150 controls mode control 105 to drive a gate of a first thick gate-oxide PMOS transistor 130 having a drain coupled to switched n-well 110. First PMOS transistor 130 has its source tied to a low voltage supply 120 that supplies the low voltage for biasing switched n-well 110 in the low voltage mode. Thus, when mode control signal 105 is de-asserted to VSS during the low voltage mode of operation for dual-mode PMOS transistor 112, first PMOS transistor 130 conducts so that switched n-well 110 is charged to the low voltage. As will be explained further herein, switched n-well 110 is charged to the high voltage from a high voltage supply 115 during the high voltage mode of operation for dual-mode PMOS transistor 112. If an n-well 155 for first PMOS transistor 130 were tied to low voltage supply 120, the p-n junction between the drain of first PMOS transistor 130 and n-well 155 could become forward biased when switched n-well 110 is charged to the high voltage. To obviate this potential for latchup, n-well 155 is tied to high voltage supply 115. First PMOS transistor 130 is thus a sufficiently large thick gate-oxide transistor so as to be robust to the voltage strain that results from the tie of its n-well 155 to high voltage supply 115.

An inverter 125 inverts mode control signal 105 into an inverted control signal 106. Inverted control signal 106 drives the gate of a second thick gate-oxide PMOS transistor 135, which is thus off in the low power mode. Because the source of second PMOS transistor 135 is tied to high voltage supply 115, control signal 106 should also be charged to the high voltage during the low-power mode of operation for dual-mode PMOS transistor 112. If control signal 106 were instead just charged to the low voltage during this time, the gate voltage of second PMOS transistor 135 could be sufficiently lower than its source voltage so that second PMOS transistor 135 would conduct rather than be shut off during the low-power mode of operation for dual-mode PMOS transistor 112. Thus, high voltage supply 115 supplies the power to inverter 125 so that control signal 106 is charged to the high voltage when control signal 105 is pulled low to VSS. In this fashion, second PMOS transistor 135 is fully off during the low power mode of operation.

To select for the high power mode of operation, controller 150 asserts mode control signal 105 to the high voltage such that inverter 125 pulls inverted control signal 106 to VSS to turn second PMOS transistor 135 fully on. The drain of second PMOS transistor 135 couples to switched n-well 110 so that second PMOS transistor 135 can bias switched n-well 110 to the high voltage in response to inverted control signal 106 going low. High voltage supply 115 supplies the high voltage that biases switched n-well 110 when second PMOS transistor 135 is turned on. First PMOS transistor 130 is turned off in response to control signal 105 going high at this time. Thus, switched n-well 110 for dual-mode PMOS transistor 112 is biased to the high voltage when mode control signal 105 goes high. Second PMOS transistor 135 is not stressed from the high voltage since its n-well 140 is also tied to high voltage supply 115 and because its gate oxide is relatively thick. Similar to first PMOS transistor 130, second PMOS transistor 135 is sufficiently large as to be robust to such a permanent coupling of its n-well 140 to the high voltage.

Although n-well voltage switching circuit 100 advantageously biases switched n-well 110 in both the high and low power modes without using a native transistor, the power on sequence for the voltage supplies 115 and 120 requires some attention. For example, suppose that low voltage supply 120 becomes operational before high voltage supply 115. The p-n junction between the source of first PMOS transistor 130 and its n-well 155 could become forward biased if the powering on of high voltage supply 115 sufficiently lags behind that for low voltage supply 120. To prevent this possibility of latchup, high voltage supply 115 should be powered up before low voltage supply 120 during a power on sequence for n-well voltage switching circuit 100.

Figure 2:
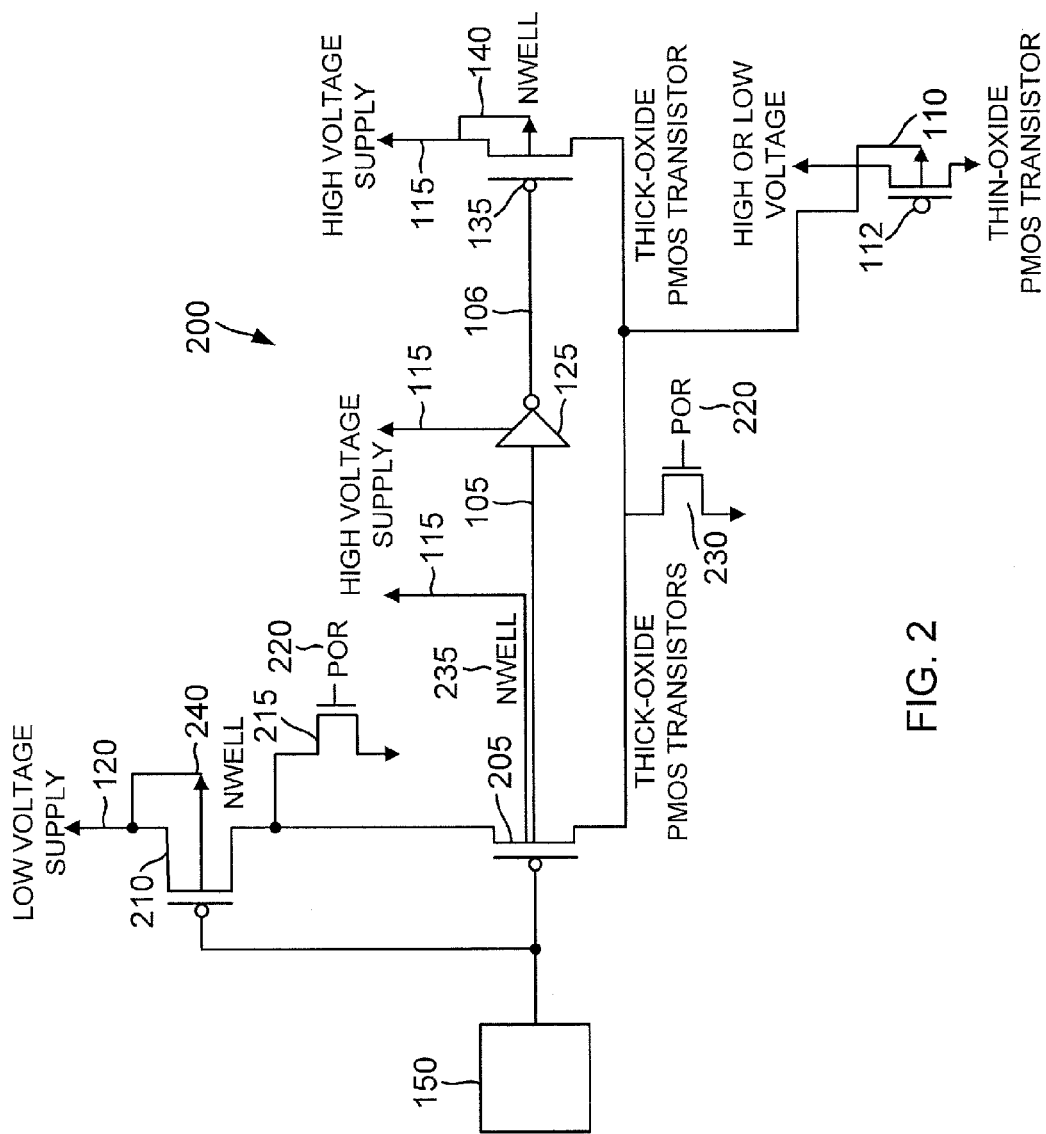
FIG. 2 is a schematic diagram for an n-well voltage switching circuit in which a high voltage supply need not be powered on before a low voltage supply during a power on sequence.

There are systems, however, that are designed to have their low voltage supply powered on before the high voltage supply. Indeed, one can appreciate that it is faster to charge a power rail that had been powered off to a low voltage than to bring an initially-off power rail to a high voltage. An n-well voltage switching circuit 200 shown in FIG. 2 is designed to be robust to latchup despite low voltage supply 120 becoming operational before high voltage supply 115 in a power on sequence. As compared to n-well voltage switching circuit 100, first PMOS transistor 130 is replaced by a first PMOS transistor 205 that does not have its source directly tied to low voltage supply 120 as does first PMOS transistor 130. Instead, the source for first PMOS transistor 205 couples to low voltage supply 120 through an isolating PMOS transistor 210. First PMOS transistor 205 has its drain tied to switched n-well 110. Thus, an n-well 235 for first PMOS transistor 205 is tied to high voltage supply 115 to protect this transistor from latchup when dual-mode PMOS transistor 112 operates in the high voltage mode.

The source for first PMOS transistor 205 couples to the drain of isolating PMOS transistor 210. The source for isolating PMOS transistor 210 and its n-well 240 are tied to low voltage supply 120. Thus, the source for first PMOS transistor 205 couples to low voltage supply 120 when isolating PMOS transistor 210 switches on. Controller 150 drives the gates of first PMOS transistor 205 and isolating PMOS transistor 210 with mode control signal 105 such that when mode control signal 105 is de-asserted (brought low) to select for a low voltage mode of operation for dual-mode PMOS transistor 112, both first PMOS transistors 205 and isolating PMOS transistor 210 are turned on so that switched n-well 110 is charged to the low voltage. But isolating PMOS transistor 210 isolates first PMOS transistor 205 from the power sequence issues discussed earlier for n-well voltage switching circuit 100. For example, if low voltage supply 120 is switched on before high voltage supply 115 in a power on sequence, the source for first PMOS transistor 205 is not charged by low voltage supply 120 as it is for first PMOS transistor 130 in n-well voltage switching circuit 100 because isolating PMOS transistor 210 is off during the power on sequence. The p-n junction between the source of first PMOS transistor 205 and its n-well 235 is thus protected from becoming forward biased if low voltage supply 120 powers up before high voltage supply 115. In one embodiment, isolating PMOS transistor 210 comprises a means for protecting first PMOS transistor 205 from latchup despite the use of a power-on sequence in which low voltage supply 120 powers up before high voltage supply 115.

As a safety measure, the source for first PMOS transistor 205 and the drain for isolating PMOS transistor 210 are coupled to ground during a power on reset (POR) period through a first NMOS transistor 215 that has its gate driven by a POR signal 220. Similarly, the drain for first PMOS transistor 205 is coupled to ground during the POR period through a second NMOS transistor 230 that has its gate driven by POR signal 220. The source for first NMOS transistor 215 as well as the source for second NMOS transistor 230 both couple to ground. As known in the power on reset arts, POR signal 220 is asserted during a power on sequence for n-well voltage switching circuit 200. Through the isolation of the source for first PMOS transistor 205 provided by isolating PMOS transistor 210 as well as the grounding action of first and second NMOS transistors 215 and 230, no latchup issue exists for n-well voltage switching circuit 200 regardless of the order in which the voltage supplies are sequenced. The remaining components of n-well voltage switching circuit (e.g., inverter 125 and second PMOS transistor 135) are configured as discussed with regard to n-well voltage switching circuit 100.

Both first PMOS transistor 205 and isolating PMOS transistor 210 are sufficiently large thick gate oxide transistors due to the tie of n-well 235 to high voltage supply 115 and because control signal 105 is asserted to the high voltage to select for the high voltage mode of operation for dual-mode transistor 112. PMOS transistors 205 and 210 thus demand die space accordingly. But there need be only one n-well voltage switching circuit 200 (or 100) to control the switched n-well potential for assorted other dual-mode PMOS transistors having the low and high voltage modes of operation. In this fashion, substantial die area savings may be realized. Dual-mode transistor PMOS transistor 112 is smaller than PMOS transistors 205, 210, 130, and 135. For example, the various instantiations of dual-mode PMOS transistor 112 may have the minimum size and gate oxide thickness allowed by the process node. In this fashion, density is greatly enhanced.

Figure 3:
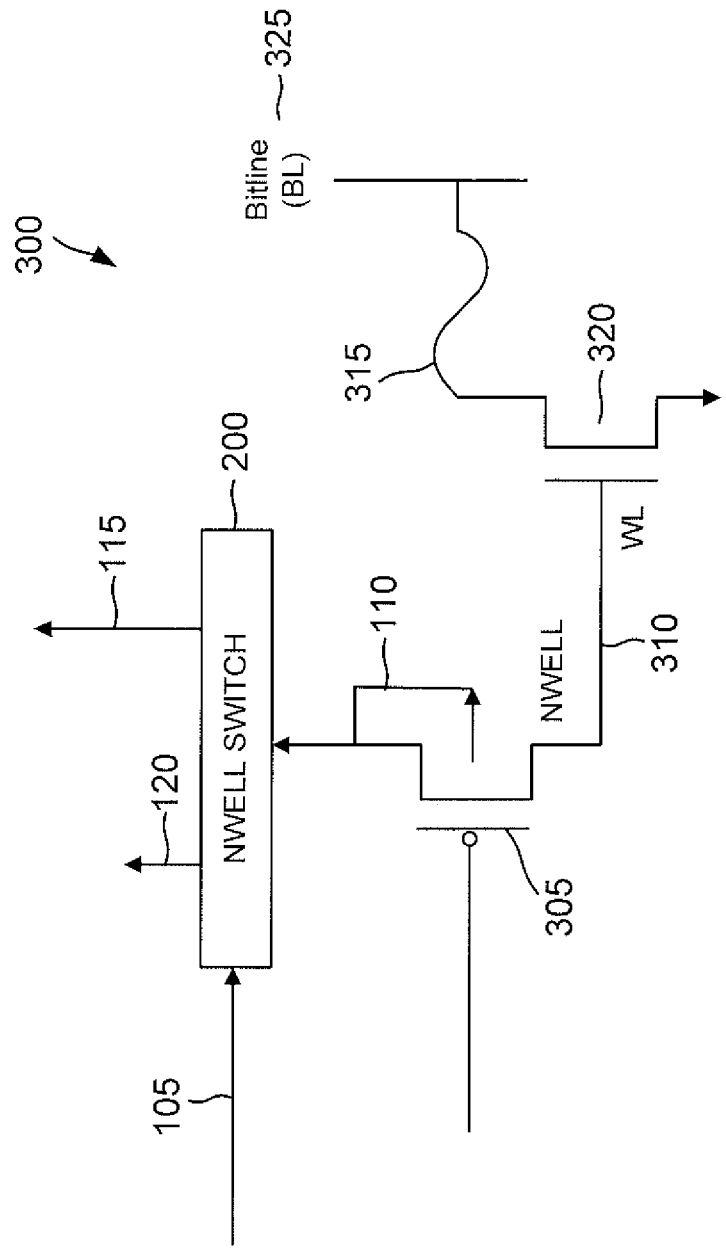
FIG. 3 is a schematic diagram for an electronically programmable memory incorporating the n-well voltage switching circuit of FIG. 1 or FIG. 2.

Numerous applications may advantageously use relatively small thin gate-oxide dual-mode PMOS transistors in switched n-wells as disclosed herein. For example, an electrically-programmable fuse (e-fuse) memory includes assorted word line drivers as well as programming transistors. In a conventional e-fuse memory, the corresponding transistors for the word line drivers and the associated programming transistors needed to be relatively large and have thick gate oxides to withstand the high voltage used to program the e-fuses. In contrast, an e-fuse memory 300 shown in FIG. 3 enables the use of small thin gate-oxide word line drivers and programming transistors, which advantageously increases density.

For illustration clarity, e-fuse memory 300 is shown with just a single word line 310 and a single bit line 325. It will be appreciated, however, that e-fuse memory 300 includes a plurality of other word lines and bit lines arranged analogously as shown for word line 310 and bit line 325. The remaining word lines would form additional rows in parallel with word line 310. Similarly, the remaining bit lines would form columns in parallel with bit line 325. When a word line is asserted by its word line driver, the corresponding e-fuses for that word line may be either read or programmed depending upon the bias for the bit lines. Each intersection of a word line and a bit line corresponds to an e-fuse. For example, an e-fuse 315 corresponds to the intersection of word line 310 and bit line 325. Each e-fuse such as e-fuse 315 comprises a fusible link that is conductive in the non-programmed state. In contrast, a programmed e-fuse is either an open circuit or much more resistive as compared to a non-programmed e-fuse. To read a given e-fuse, its word line and bit line are both asserted. Since an e-fuse should not be programmed in a read operation, the assertion of the corresponding word line and the bit line in a read operation may be performed using the low voltage. In contrast, the corresponding word line and bit line are both asserted to the high voltage to program an e-fuse. Reading the e-fuses would thus correspond to a low voltage mode of operation whereas programming the e-fuses corresponds to a high voltage mode of operation.

Given these low and high voltage modes of operation, the word line driver transistors may thus be advantageously implemented using dual-mode PMOS transistors having switched n-wells so that these transistors may remain relatively small yet be robust to the high voltage mode of operation. With regard to e-fuse 315, a small thin gate-oxide word line dual-mode word line (WL) driver PMOS transistor 305 has its drain tied to word line 310. N-well voltage switching circuit 200 controls the voltage of a switched n-well 110 for dual-mode WL driver PMOS transistor 305. Switched n-well 110 thus serves as an output node for n-well voltage switching circuit 200. It will be appreciated, however, that n-well voltage switching circuit 200 may be replaced by alternative n-well switching circuit embodiments such as n-well voltage switching circuit 100. The source of dual-mode WL driver PMOS transistor 305 is also tied to switched n-well 110 so that the voltage bias for both its source and switched n-well 110 are controlled by mode control signal 105. Thus, if e-fuse 315 is to be programmed, n-well voltage switching circuit 200 biases the source and switched n-well 110 for WL driver PMOS transistor 305 to the high voltage.

A word line decoder (not illustrated) selects for word line 310 by pulling the gate of dual-mode WL driver PMOS transistor 305 low. In response, dual-mode WL driver PMOS transistor 305 turns on and biases word line 310 to the high voltage for a programming (fuse burning) operation. Conversely, dual-mode WL driver PMOS transistor 305 turns on and biases word line 310 to the low voltage during a read operation as discussed further herein. Word line 310 controls a gate of a small thin gate-oxide programming NMOS transistor 320 having its source tied to ground and a drain tied to a terminal of e-fuse 315. A power switch (not illustrated in FIG. 3 but shown and discussed further with regard to FIG. 4) biases bit line 325 to the high voltage during the programming mode and to the low voltage during a read operation. When the word line decoder selects for word line 310 by pulling the gate of dual-mode WL driver PMOS transistor 305 to VSS during a programming operation in conjunction with mode control signal 105 being asserted to the high voltage, the gate of programming NMOS transistor 320 is then biased to the high voltage. In response, programming NMOS transistor 320 turns on so that a relatively large amount of current will flow through e-fuse 315 because bit line 325 is charged to the high voltage at this time. This relatively large current then programs e-fuse 315.

To read the state of e-fuse 315, mode control signal 105 is pulled low to control n-well voltage switching circuit 200 to bias the source and switched n-well 110 of dual-mode WL driver PMOS transistor 305 to the low voltage. If the gate of dual-mode WL driver PMOS transistor 305 is then pulled low during a read operation, this transistor will then turn on to charge word line 310 to the low voltage so as to turn on NMOS programming transistor 320. During this read operation, bit line 325 is biased to the low voltage by the bit line's power switch. If e-fuse 315 is not programmed, the assertion of word line 310 will pull the charged bit line 325 towards ground because of the conduction through NMOS programming transistor 320. In contrast, if e-fuse 315 had been programmed, bit line 325 will not be pulled to ground as strongly despite NMOS programming transistor 320 being turned on. A sense amplifier (not illustrated) coupled to bit line 325 may thus read the programmed state of e-fuse 315 according to whether the bit line voltage drops or not. But the low voltage on bit line 325 during the read operation keeps the current level through e-fuse 315 to a safe level to prevent any unwanted fuse programming during the read operation.

Although dual-mode WL driver PMOS transistor 305 is protected from latchup because its switched n-well potential is controlled by n-well voltage switching circuit 200, it is not robust to a sufficiently long period of high voltage operation since it is a small thin gate-oxide transistor. But the programming of an e-fuse takes a relatively short amount of time as compared to the high voltage longevity of such a small thin gate-oxide transistor. Controller 150 (shown in FIGS. 1 and 2) controls the state of mode control signal 105 so as to assert mode control signal 105 only for the relatively short amount of time necessary to program e-fuse 315. In this fashion, both dual-mode WL driver PMOS transistor 305 and programming NMOS transistor 320 are biased by the high voltage only for the duration necessary to program e-fuse 315. Thus, both of these transistors can take advantage of the small dimensions and thin gate-oxide thickness available in modern process nodes, which greatly enhances density. For example, if memory 300 includes a plurality N of word lines and the same plurality N of bit lines, it would include $N^2$ e-fuses and would thus require $N^2$ programming NMOS transistors and N dual-mode WL driver PMOS transistors. The die area savings are thus quadratically related to the size of the memory.

Figure 4:
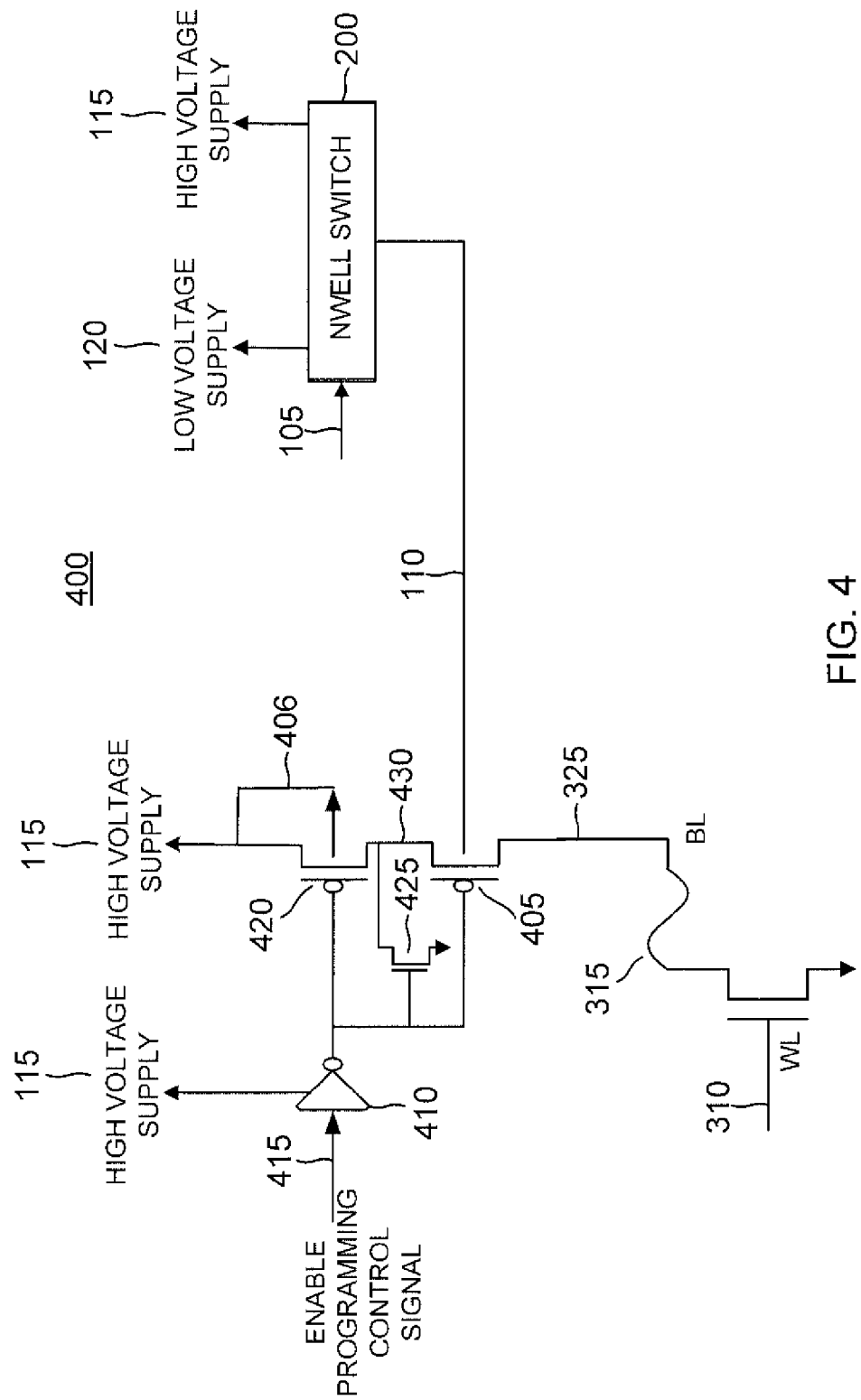
FIG. 4 is a schematic diagram of a high voltage switch for a bit line in the memory of FIG. 3.

The n-well voltage switching circuits discussed herein may also be applied to the power switch used to pull bit line 325 to the high voltage during the programming mode. In that regard, it is advantageous to include a global power switch in series with a local power switch for the high-voltage charging of bit line 325. In a conventional e-fuse memory, both these switches would comprise relatively large thick gate-oxide PMOS transistors having their n-wells permanently tied to high voltage supply 115 to prevent latchup. But as shown in FIG. 4 for a memory 400, a local power switch comprises a relatively small thin gate-oxide PMOS transistor 405 having its switched n-well 110 controlled by n-well voltage switching circuit 200 (or 100). A global power switch comprises a relatively large thick gate-oxide PMOS transistor 420 having its source and an n-well 406 tied to high-voltage supply 115. Local power switch PMOS transistor 405 couples in series between bit line 325 and a drain for global power switch PMOS transistor 420. An enable programming control signal 415 is inverted through an inverter 410 to drive the gates of both PMOS transistors 405 and 420. Thus, when enable programming control signal 415 is asserted high to select for the programming mode for e-fuse 315, PMOS transistors 405 and 420 are both switched on so that bit line 325 is charged to the high voltage from high voltage supply 115. In this embodiment, enable programming control signal 415 is also the mode control signal 105 for n-well voltage switching circuit 200. Thus, when enable programming control signal 415 is asserted, switched n-well 110 is also charged to the high voltage through n-well voltage switching circuit 200.

After e-fuse 315 has been programmed, enable programming control signal 415 is de-asserted low so that local power switch PMOS transistor 405 and global power switch PMOS transistor 420 are both turned off. At the same time, n-well voltage switching circuit 200 biases switched n-well 110 to the low voltage. But note that a source 430 for local power switch PMOS transistor 405 was charged to the high voltage during the programming mode. Should this source node 430 have enough residual charge from when it was charged to the high voltage to forward bias the p-n junction between it and switched n-well 110 when switched n-well 110 is subsequently charged to the low voltage, latchup could occur. To prevent any possibility of latchup occurring from this charged node potential as compared to a low voltage for switched n-well 110, an NMOS transistor 425 is configured to pull source 430 for local power switch PMOS transistor 405 to ground after completion of an e-fuse programming. To do so, inverter 410 drives the gate of NMOS transistor 425 such that NMOS transistor 425 turns on in response to the de-assertion of enable programming mode control signal 415 during a read operation. A source of NMOS transistor 425 is tied to ground whereas its drain is tied to source 430 for local power switch PMOS transistor 405. In this fashion, NMOS transistor 425 will pull the potential for source 430 to ground when e-fuse memory 400 is not in the programming mode. A separate low voltage switch (not illustrated) would be active during a read mode of operation for memory 400 to charge bit line 325 to the low voltage. Memory 400 includes a local power switch 405 for each of its bit lines so that the die savings enabled by its small size and thin gate-oxide is significant. Without an n-well switching circuit 200, the local power switches would all need to be relatively large thick gate-oxide transistors because their n-wells would be permanently tied to the high voltage supply. An example method of operation for the n-well switching circuits disclosed herein will now be discussed.

Example Method of Operation

Figure 5:
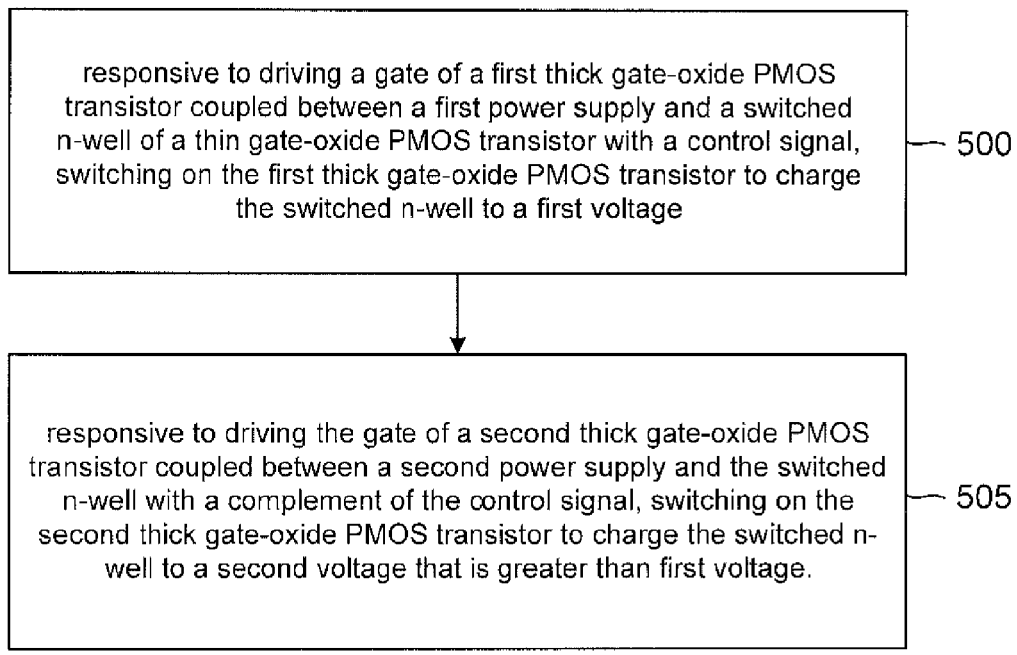
FIG. 5 is a flowchart for an example method of operation for the n-well voltage switching circuits disclosed herein.

Both n-well voltage switching circuits 100 and 200 discussed above include a first PMOS transistor and a second PMOS transistor. The first PMOS transistor biases the switched n-well to the low voltage whereas the second PMOS transistor biases the switched n-well to the high voltage. A flowchart for an example method of operation for these transistors is shown in FIG. 5. The method includes an act 500 that is responsive to driving a gate of a first thick gate-oxide PMOS transistor coupled between a first voltage supply and a switched n-well of a thin gate-oxide PMOS transistor with a control signal and comprises switching on the first thick gate-oxide PMOS transistor to charge the switched n-well to a first voltage. The method includes another act 505 that is responsive to driving the gate of a second thick gate-oxide PMOS transistor coupled between a second voltage supply and the switched n-well with a complement of the control signal and comprises switching on the second thick gate-oxide PMOS transistor to charge the switched n-well to a second voltage that is greater than the first voltage.

As those of some skill in this art will by now appreciate and depending on the particular application at hand, many modifications, substitutions and variations can be made in and to the materials, apparatus, configurations and methods of use of the devices of the present disclosure without departing from the spirit and scope thereof. In light of this, the scope of the present disclosure should not be limited to that of the particular embodiments illustrated and described herein, as they are merely by way of some examples thereof, but rather, should be fully commensurate with that of the claims appended hereafter and their functional equivalents.

We claim:

1. An n-well voltage switching circuit, comprising:
a first thick gate-oxide PMOS transistor having a gate configured to be responsive to a control signal, a source coupled to a low voltage supply configured to provide a low voltage, and a drain tied to a switched n-well for a thin gate-oxide dual-mode PMOS transistor; and
a second thick gate-oxide PMOS transistor having a gate configured to be responsive to an inverted version of the control signal, a source tied to a high voltage supply, and a drain tied to the switched n-well, wherein the high voltage supply is configured to provide a high voltage that is greater than the low voltage.

2. The n-well voltage switching circuit of claim 1, further comprising an inverter configured to invert the control signal to provide the inverted version of the control signal.

3. The n-well voltage switching circuit of claim 2, wherein the first thick gate-oxide PMOS transistor has an n-well tied to the high voltage supply, and wherein the second thick gate-oxide PMOS transistor has an n-well tied to the high voltage supply.

4. The n-well voltage switching circuit of claim 3, further comprising an isolating PMOS transistor having a gate configured to be responsive to the control signal, a source tied to the low voltage supply, and a drain tied to the source of the first thick gate-oxide PMOS transistor such that the source of the first thick gate-oxide PMOS transistor is coupled to the low voltage supply through a channel for the isolating PMOS transistor.

5. The n-well voltage switching circuit of claim 4, wherein an n-well for the isolating PMOS transistor is tied to the low voltage supply.

6. The n-well voltage switching circuit of claim 4, further comprising a first NMOS transistor having a source coupled to ground and a drain coupled to the source of the first thick gate-oxide PMOS transistor, wherein the first NMOS transistor is configured to switch on responsive to a power-on-reset (POR) signal.

7. The n-well voltage switching circuit of claim 6, further comprising a second NMOS transistor having a source coupled to ground and a drain coupled to the drain of the first thick gate-oxide PMOS transistor, wherein the second NMOS transistor is configured to switch on responsive to the POR signal.

8. The n-well voltage switching circuit of claim 2, wherein the inverter is configured to be powered by the high voltage supply.

9. A memory, comprising:
an n-well voltage switching circuit configured to selectively drive an output node to a low voltage and also to a high voltage that is greater than the low voltage, the n-well voltage switching circuit including a first PMOS transistor having a gate configured to be responsive to a control signal, a source coupled to a low voltage supply configured to provide the low voltage, and a drain tied to the output node, and a second PMOS transistor having a gate configured to be responsive to an inverted version of the control signal, a source tied to a high voltage supply configured to provide the high voltage, and a drain tied to the output node; and
a word line driver PMOS transistor including a source and a switched n-well tied to the output node, wherein the word line driver PMOS transistor has a thin gate-oxide thickness that is less than a thick gate-oxide thickness for the first and second PMOS transistors.

10. The memory of claim 9, wherein the memory is an electrically-programmable memory further comprising an e-fuse having a terminal coupled to a drain of a thin gate-oxide programming NMOS transistor, the thin gate-oxide programming NMOS transistor having its gate coupled to a word line, the word line being coupled to a drain for the word line driver PMOS transistor.

11. The memory of claim 10, further comprising a bit line coupled to an opposing terminal of the e-fuse.

12. The memory of claim 11, further comprising a power switch for biasing the bit line to the high voltage during a programming mode for the e-fuse.

13. The memory of claim 12, wherein the power switch includes a global power switch and a local power switch in series between the bit line and the high voltage supply.

14. The memory of claim 13, wherein the local power switch comprises a PMOS transistor having a switched n-well coupled to the output node of the n-well voltage switching circuit.

15. An n-well voltage switching circuit, comprising:
a first thick gate-oxide PMOS transistor having a gate configured to be responsive to a control signal, a source coupled to a low voltage supply configured to provide a low voltage, and a drain tied to a switched n-well for a thin gate-oxide dual-mode PMOS transistor;
a second thick gate-oxide PMOS transistor having a gate configured to be responsive to an inverted version of the control signal, a source tied to a high voltage supply, and a drain tied to the switched n-well, wherein the high voltage supply is configured to provide a high voltage that is greater than the low voltage and is configured to power on after a power on for the low voltage supply during a power on sequence for the n-well voltage switching circuit; and
means for protecting the first thick gate-oxide PMOS transistor from latchup due to the power-on sequence for the n-well voltage switching circuit.

16. A method, comprising
responsive to driving a gate of a first thick gate-oxide PMOS transistor coupled between a first voltage supply and a switched n-well of a thin gate-oxide dual-mode PMOS transistor with a control signal, switching on the first thick gate-oxide PMOS transistor to bias the switched n-well to a first voltage; and
responsive to driving the gate of a second thick gate-oxide PMOS transistor coupled between a second voltage supply and the switched n-well with a complement of the control signal, switching on the second thick gate-oxide PMOS transistor to bias the switched n-well to a second voltage that is greater than the first voltage.

17. The method of claim 16, further comprising controlling a duration for the driving of the gate of the second thick gate-oxide PMOS transistor such that the thin gate-oxide dual-mode PMOS transistor is not damaged by the bias of its switched n-well with the second voltage.

18. The method of claim 16, wherein the thin gate-oxide dual-mode PMOS transistor is a dual-mode word line driver transistor for an electrically-programmable memory, and wherein biasing the switched n-well with the second voltage comprises programming an e-fuse responsive to driving the gate of the dual-mode word line driver transistor.

19. The method of claim 18, wherein biasing the switched n-well with the first voltage comprises reading a state of the e-fuse.

* * * * *